United States Patent [19]
Butler et al.

[11] Patent Number: 4,647,867
[45] Date of Patent: Mar. 3, 1987

[54] HIGH-FREQUENCY, HIGH-GAIN, PUSH-PULL AMPLIFIER CIRCUIT

[75] Inventors: Scott J. Butler, Rochdale; Robert J. Regan, Needham, both of Mass.

[73] Assignee: GTE Laboratories Incorporated, Waltham, Mass.

[21] Appl. No.: 809,689

[22] Filed: Dec. 16, 1985

[51] Int. Cl.[4] .............................................. H03F 3/26
[52] U.S. Cl. ................................ 330/269; 330/276; 330/292; 330/307; 357/22
[58] Field of Search ................ 330/77, 269, 276, 277, 330/286, 292, 307; 357/22

[56] References Cited

U.S. PATENT DOCUMENTS

| | | | |
|---|---|---|---|
| 2,218,309 | 10/1940 | Davis et al. | 330/77 X |
| 2,548,770 | 4/1951 | Caraway | 330/77 |
| 3,156,872 | 11/1964 | Tongue | 330/292 |
| 3,848,198 | 11/1974 | De Brecht et al. | 330/286 X |

OTHER PUBLICATIONS

Gray et al, *Radio Transmitters*, McGraw-Hill, 1961, pp. 64, 65.
Della-Mussia, "100 Watts at 1 GHz with the First Hyperfrequency SIT on the Market", *Electron & Appl. Ind.*, (France), No. 275, Nov. 1, 1975, pp. 36, 37.

*Primary Examiner*—James B. Mullins
*Attorney, Agent, or Firm*—David M. Keay

[57] ABSTRACT

A high-gain, high-frequency, high-power, push-pull amplifier employing a pair of static induction transistors (SIT's) in common-source configuration. A pair of capacitances each of approximately the same capacitive value as the drain-to-gate parasitic feedback capacitance of each SIT are cross-coupled between the drains and gates of the pair of SIT's to neutralize the drain-to-gate capacitances and provide stable operation.

1 Claim, 8 Drawing Figures

HIGH-FREQUENCY, HIGH-GAIN, PUSH-PULL AMPLIFIER CIRCUIT

BACKGROUND OF THE INVENTION

This invention relates to amplifiers employing semiconductor devices. More particularly, it is concerned with high frequency, high gain, amplifier circuits employing field effect transistors.

One type of semiconductor device which provides a combination of high power, high frequency, good gain efficiency, and high breakdown voltage is a form of field effect transistor (FET) known as the static induction transistor (SIT). By employing these devices it is possible to design and implement efficient, high gain, high frequency, power amplifiers and oscillators capable of operating with high DC supply voltages. Static induction transistors are a special class of junction field effect transistors in which electrical current flows "vertically" between the source and drain and is controlled by an induced electric potential barrier under the source.

Amplifiers having high power gain and operating at high frequency with high drain efficiency have been constructed employing a single static induction transistor in the common-gate configuration. Static induction transistors operated in a common-source configuration are capable of providing very high gain at high frequencies. However, when they are operated in this configuration, the inherent parasitic drain-to-gate capacitance provides a positive feedback path which may result in instability and/or oscillation.

SUMMARY OF THE INVENTION

High frequency operation with high gain are obtained in common-source push-pull amplifier circuits in accordance with the present invention. The circuit comprises first and second field effect transistors each having source, drain, and gate electrodes, and each having a drain-to-gate parasitic capacitance. The source electrodes of both field effect transistors are connected to a common point of reference potential. The circuit includes first and second neutralizing capacitances each having a capacitance value approximately equal to the drain-to-gate parasitic capacitance of a single field effect transistor. The first neutralizing capacitance is connected between the drain electrode of the first field effect transistor and the gate electrode of the second field effect transistor, and the second neutralizing capacitance is connected between the drain electrode of the second field effect transistor and the gate electrode of the first field effect transistor. The circuit also includes an input terminal and an output terminal. An input means is connected to the input terminal and to the gate electrodes of the first and second field effect transistors for applying inputs of opposite phase to the gate electrode in response to an input signal received at the input terminal. An output circuit means is connected to the drain electrodes of the first and second field effect transistors and to the output terminal for combining the outputs of opposite phase at the drain electrodes to produce an output signal at the output terminal. The circuit also includes voltage source means for applying operating potential to the field effect transistors.

In certain of the figures the various elements are not drawn to scale. Certain dimensions are exaggerated in relation to other dimensions in order to present a clear understanding of the invention.

For a better understanding of the present invention, together with other and further objects, advantages, and capabilities thereof, reference is made to the following disclosure and appended claims in connection with the above-described drawings.

DETAILED DESCRIPTION OF THE INVENTION

Figure 1:
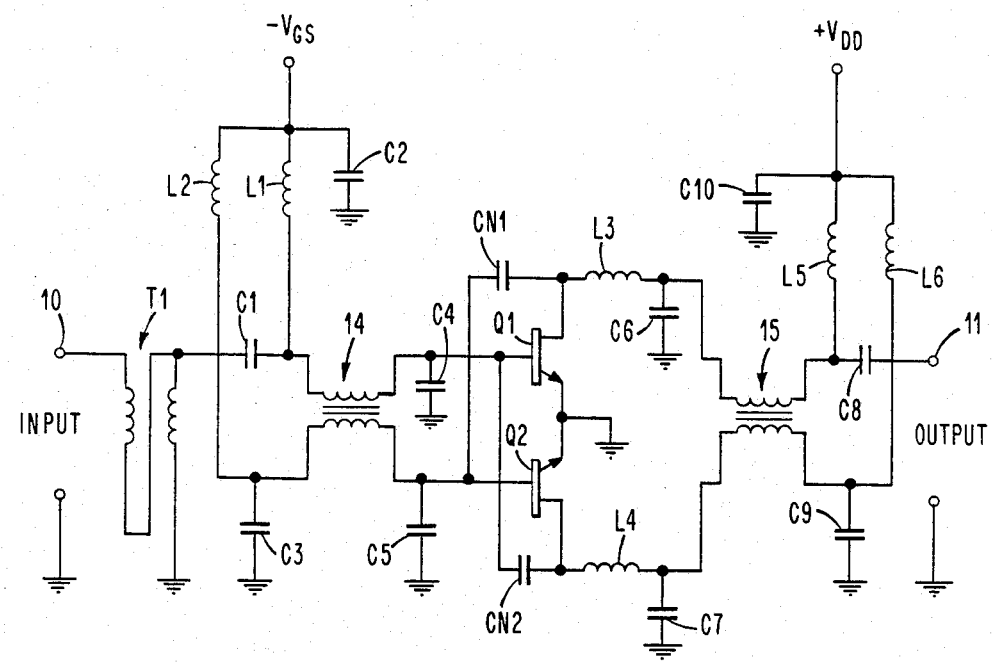
FIG. 1 is a circuit diagram of a common-source push-pull amplifier circuit in accordance with the present invention.

FIG. 1 is a schematic circuit diagram of a push-pull amplifier employing SIT's connected in a common-source configuration in accordance with the present invention. The amplifier circuit includes an input terminal 10 and an output terminal 11. The input terminal 10 is connected by way of a 4:1 transmission line transformer T1 and a capacitance C1 to a first input of a balun 14. A $-V_{GS}$ voltage source is connected through inductances L1 and L2 in parallel to the two inputs of the balun 14. The $-V_{GS}$ voltage source is also connected to ground through a capacitance C2. The second input of the balun 14 is connected through a capacitance C3 to ground, and both outputs of the balun 14 are connected through capacitances C4 and C5 in parallel to ground.

The first and second outputs of the balun 14 are connected directly to the gates of first and second SIT's Q1 and Q2, respectively. The source of the SIT's Q1 and Q2 are connected in common to ground. A first neutralizing capacitance CN1 is connected between the drain of the first SIT Q1 and the gate of the second SIT Q2, and a second neutralizing capacitance CN2 is connected between the drain of the second SIT Q2 and the gate of the first SIT Q1. The capacitive values of the individual neutralizing capacitances CN1 and CN2 are each equal to the drain-to-gate parasitic capacitance of the individual SIT's Q1 and Q2.

The drain of the first SIT Q1 is connected through an inductance L3 to the first input of a second balun 15. The juncture between the inductance L3 and the first input of the second balun 15 is connected to ground through a capacitance C6. The drain of the second SIT Q2 is connected through an inductance L4 to the second input of the second balun 15. The juncture of the inductance L4 and second input of the second balun 15 is connected to ground through a capacitance C7. The first output of the second balun 15 is connected through a capacitance C8 to the output terminal 11. Operating voltage to the drains of the SIT's is provided from a $+V_{DD}$ voltage source which is connected through inductances L5 and L6 in parallel to the outputs of the second balun 15. The juncture of the second output of the second balun 15 with the inductance L6 is connected to ground through a capacitance C9. A capacitance C10 is connected between the $+V_{DD}$ voltage source and ground.

Figure 2:
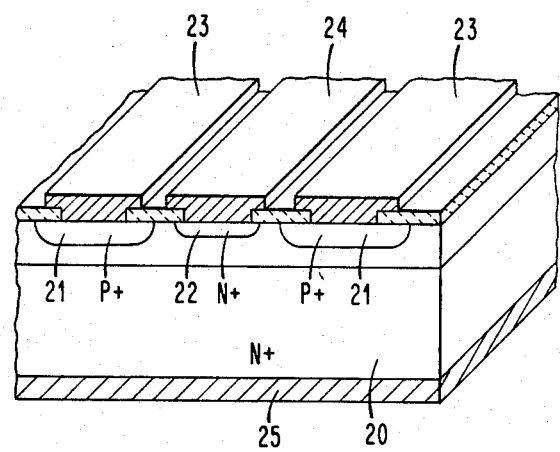
FIG. 2 is an elevational view in cross-section illustrating a portion of an SIT chip employed in the circuit of FIG. 1.

FIG. 2 illustrates a portion of an SIT of the type known as a surface gate SIT which may be employed in the amplifier circuit of FIG. 1. The SIT as illustrated is fabricated in a body 20 of single crystal semiconductor material, specifically silicon, of N-type conductivity. Inset at the upper surface of the body 20 are laterally extending P-type gate regions 21. Interdigitized with the P-type gate regions 21 are source regions 22 of N-type conductivity inset in the body at the upper surface. Metal contact members 23 which are in ohmic contact with the P-type gate regions 21 at the upper surface of the body 20 are connected together at a common bonding pad (not shown). The source regions 22 are in ohmic contact with metal contact members 24 which are connected in common to a source bonding pad (not shown). The bottom surface of the wafer 20 is coated with conductive contact material 25 which serves as a drain contact member.

Figure 3:
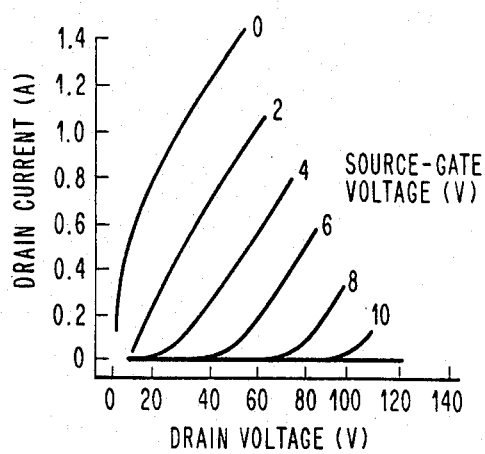
FIG. 3 illustrates operating dc current-voltage characteristic curves of SIT's employed in the circuit of FIG. 1.

Under operating conditions electrical current flows from the source regions 22 vertically through the body 20 of semiconductor material, rather than laterally, to the drain contact member 25. The flow of current is controlled by the control voltage applied to the gate regions 21 and by the potential applied to the drain electrode. FIG. 3 illustrates the characteristic curves of drain current versus drain voltage for devices of this type.

Figure 4:
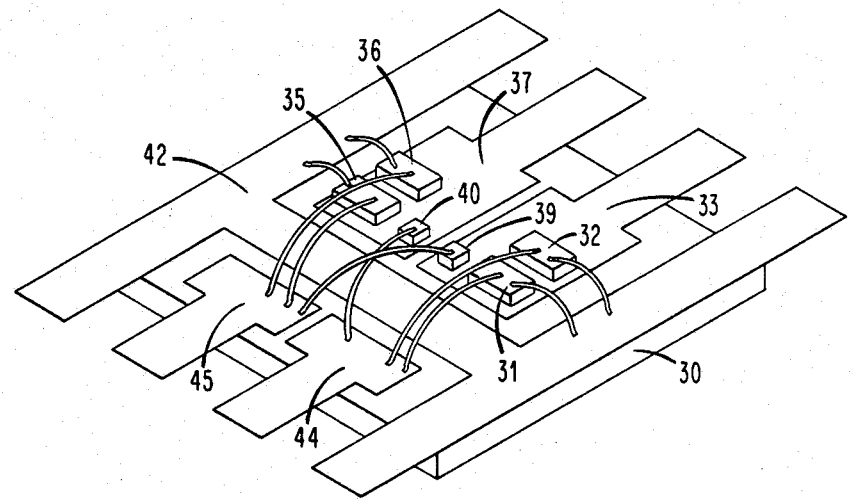
FIG. 4 is a pictorial representation of the arrangement of SIT's and neutralizing capacitances in a single package in a specific embodiment of the circuit of FIG. 1.

FIG. 4 illustrates an arrangement for mounting the SIT's and neutralizing capacitances of the circuit of FIG. 1 in a single package so as to minimize inductive effects. The components are mounted on a base or substrate of high thermal conductivity electrically insulating material 30 having a pattern of conductive mounting pads with terminals extending therefrom. The first SIT Q1 in the form of two chips 31 and 32 having their sources connected together in parallel and their gates connected together in parallel are mounted with the drain contact members in contact with a conductive pad and terminal 33. Similarly, chips 35 and 36 constituting the second SIT Q2 are mounted on a pad and terminal 37.

A chip 39 containing the first neutralizing capacitance CN1 is mounted directly on the pad 33 in close proximity to the chips 31 and 32. Similarly, the second neutralizing capacitance CN2 fabricated in a chip 40 is mounted on pad 37 in close proximity to the SIT chips 35 and 36. Thus, exceptionally good low impedance electrical connections are obtained between the drains of the SIT's and the neutralizing chip capacitors.

Leads are connected from the source contact members of the chips 31, 32, 35, and 36 to an arrangement of mounting pads and terminals 42 which serves as the ground conductor. The gates of the first SIT in chips 31 and 32 are connected to a bonding pad and terminal 44, and the gates of the second SIT in chips 35 and 36 are connected to another bonding pad and terminal 45. The chip 39 of the first neutralizing capacitance CN1 is connected to pad 45 and the chip 40 containing the second neutralizing capacitance CN2 is connected to pad 44. With this arrangement the shortest possible lead length is provided between the electrodes of the two SIT's and the two neutralizing capacitances thereby minimizing inductive effects.

The amplifier circuit as illustrated in FIG. 1 operates as a push-pull amplifier. Input signals applied at the input terminal 10 are split into inputs of opposite phase by the first balun 14 and applied to the gate of the SIT's Q1 and Q2. The out-of-phase outputs at the drains of the SIT's Q1 and Q2 are combined by the balun 15 to produce an amplified output signal at the output terminal 11. The parasitic drain-to-gate feedback capacitances of the two SIT's are neutralized by the presence of the two neutralizing capacitances CN1 and CN2. The cross-coupling connections of the neutralizing capacitances CN1 and CN2 as shown result in a capacitive bridge. Since capacitive values of the individual neutralizing capacitances CN1 and CN2 are approximately the same as the capacitive values of the drain-to-gate capacitances of the individual SIT's, the bridge is balanced, thereby "nulling out" any possible feedback signals from the output to the input. In addition, mounting of these components in close proximity within a single package makes it possible to use very short bond wires to connect them, thus eliminating the potential for resonance conditions. The processes for fabricating SIT's and chip capacitors are compatible; and, therefore, the components are amenable to fabrication in a single chip, thus eliminating or reducing lead lengths to an absolute minimum.

In one specific embodiment the SIT's Q1 and Q2 were each constituted of two chips having three device cells per chip with the electrodes connected in parallel. The SIT structure was a surface gate SIT having a pitch, or distance between gate regions, of 7 microns. The active area of each SIT as measured by the linear dimensions of the gate junctions was 12 cm. Each SIT chip was approximated 2 mm by 1 mm. Each of the neutralizing capacitances CN1 and CN2 was a chip capacitor approximately 0.5 mm by 0.5 mm having a capacitive value of 27 pF. The input transformer T1 was a 4:1 coaxial transformer, and the baluns 14 and 15 were wound on high permittivity ferrite toroids. The capacitors and inductors had the following values:

| | |
|---|---|
| C1 | 0.1 $\mu$F and 120 pF in parallel |
| C2 | 2.2 $\mu$F and 4 $\mu$F in parallel |
| C3 | 0.1 $\mu$F and 120 pF in parallel |
| C4 | 5.1 pF |
| C5 | 5.1 pF |
| C6 | 9.2 pF |
| C7 | 9.2 pF |
| C8 | 150 pF and 1000 pF in parallel |
| C9 | 150 pF and 1000 pF in parallel |
| C10 | 4 $\mu$F and 1000 pF in parallel |
| L1 | 18 $\mu$H |
| L2 | 18 $\mu$H |

| | -continued | |
|---|---|---|
| L3 | 14 nH | |
| L4 | 14 nH | |
| L5 ⎫ | 20 turns AWG 20 wire on | |
| L6 ⎭ | Ferroxcube #570472 cores | |

This amplifier circuit was driven by a 50 ohm source with a 50 ohm load at the output.

Figure 5:
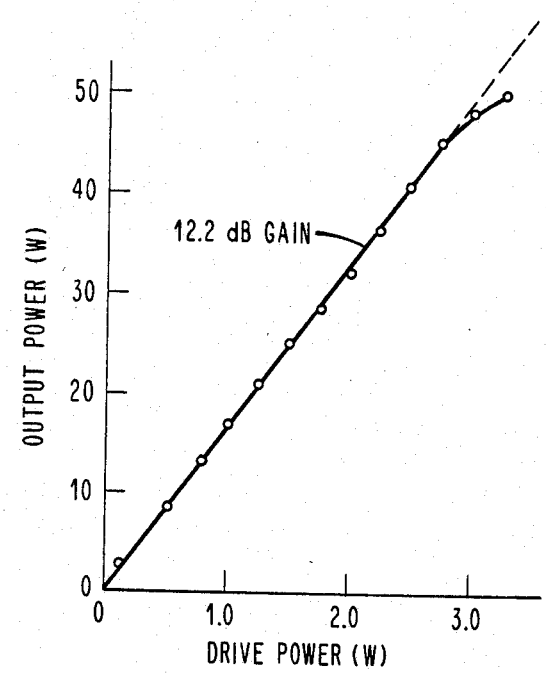
FIG. 5 is a curve of the output power versus input power of a specific embodiment of applicants' invention under CW operating conditions.

FIG. 5 illustrates the output power versus drive power for CW operation of the specific embodiment as described at 100 MHz. The voltage source $V_{DD}$ was +50 V and the voltage source $V_{GS}$ was −8 V. As can be seen, 50 W of continuous output power was obtained with 12.2 dB power gain.

Figure 6:
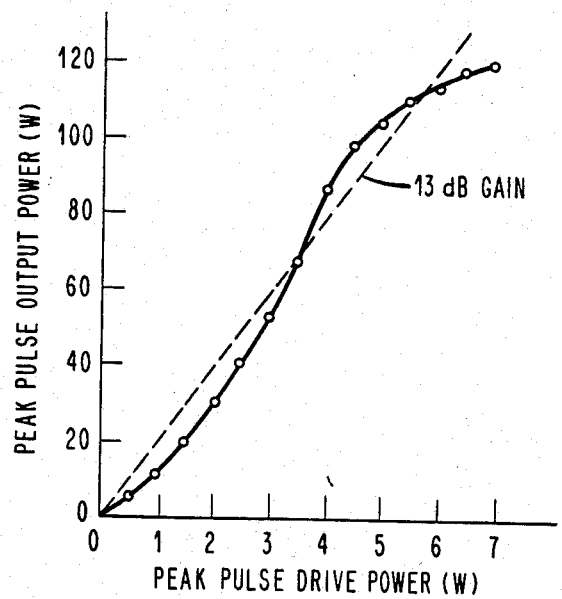
FIG. 6 is a curve of output power versus input power of a specific embodiment of applicants' invention under pulsed-power operating conditions.

FIG. 6 illustrates the output power versus drive power for pulsed operation at 100 MHz. The duty factor was 10% with a 200 μs on time. The voltage source $V_{DD}$ was +60 V and the voltage source $V_{GS}$ was −9.8 V. A peak output power level of 120 W was obtained with 13 dB power gain and 40% average efficiency.

Figure 7A:
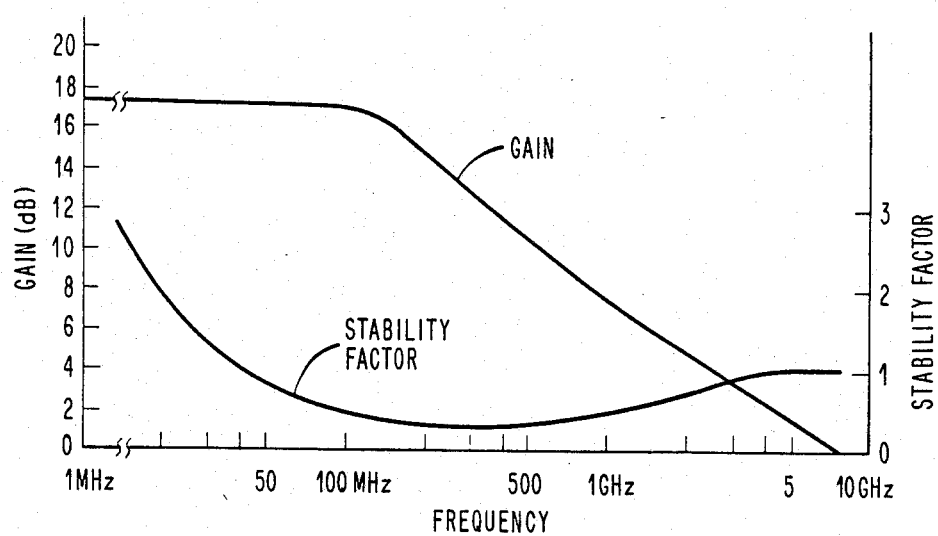
FIG. 7A is curves illustrating the calculated small-signal gain and stability factor of a single SIT connected in the common-source configuration.
Figure 7B:
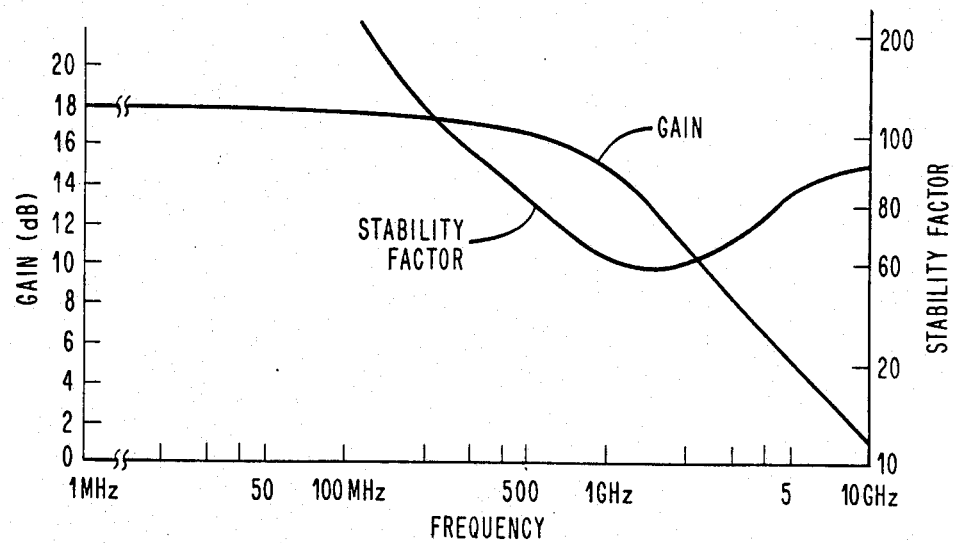
FIG. 7B is curves illustrating the calculated small-signal gain and stability factor of a push-pull amplifier with SIT's connected in common-source configuration in accordance with the present invention.

In order to illustrate the improvement in performance which is realized from employing an amplifier circuit in accordance with the invention utilizing cross-neutralized push-pull SIT's, analyses of small-signal gain and Rollett stability factor were calculated. Small-signal gain and stability factor of a single common-source SIT were calculated as a function of frequency. The results of this computed analysis is illustrated in the curves of FIG. 7A. The stability factor between 50 MHz and 3 GHz is less than unity, indicating the high probability of spurious oscillations when this device is operated in an amplifier circuit. The analysis was also performed for a common-source push-pull SIT cross-neutralized in accordance with the present invention. The results are illustrated in the curve of FIG. 7B. The computed stability factor across the entire frequency band was greater than 30, indicating unconditional stability. High gain (>14 dB) can be obtained at HF, VHF and UHF.

Amplifier circuits in accordance with the present invention employing SIT's connected in a common-source push-pull configuration provide high gain over a wide range of frequencies. SIT's operate at relatively high voltages and exhibit high breakdown voltage, thus permitting operation at high power levels. In addition, the cross-coupled neutralizing capacitance provide unconditional operational stability.

While there has been shown and described what is considered a preferred embodiment of the present invention, it will be obvious to those skilled in the art that various changes and modifications may be made therein without departing from the invention as defined by the appended claims.

What is claimed is:

1. A high frequency, high gain, push-pull amplifier circuit comprising first and second static induction transistors, each having source, drain, and gate electrodes and each having drain-to-gate parasitic capacitance;

the source electrodes of both static induction transistors being connected to a common point of reference potential;

first and second neutralizing capacitances each having a capacitance value approximately equal to the drain-to-gate parasitic capacitance of a static induction transistor, said first neutralizing capacitance being connected between the drain electrode of the first static induction transistor and the gate electrode of the second static induction transistor and said second neutralizing capacitance being connected between the drain electrode of the second static induction transistor and the gate electrode of the first static induction transistor;

an input terminal;

an output terminal;

input circuit means connected to said input terminal and to the gate electrodes of said first and second static induction transistors for applying inputs of opposite phase to said gate electrodes in response to an input signal received at said input terminal;

output circuit means connected to the drain electrodes of said first and second static induction transistors and to said output terminal for combining the outputs of opposite phase at said drain electrodes to produce an output signal at said output terminal; and voltage source means for applying operating potentials to said static induction transistors;

wherein said input circuit means includes balun means for providing balanced inputs of opposite phase to said gate electrodes from an unbalanced input signal at said input terminal;

said output circuit means includes balun means for producing an unbalanced output signal at said output terminal from balanced outputs at the drain electrodes of said first and second static induction transistors;

each of said static induction transistors includes
  a body of semiconductor material of one conductivity type having opposite first and second surfaces;
  a set of laterally extending source regions of the one conductivity type inset in said first surface;
  a set of laterally extending gate regions of the opposite conductivity type inset in said first surface and interdigitated with said source regions; and
  a source contact member in ohmic contact with said source region at said first surface, a gate contact member in ohmic contact with said gate regions at said first surface, and a drain contact member in ohmic contact with said body at second surface;
  whereby the flow of electrical current from said source regions to said drain contact member is controlled by the potential applied to said gate regions;

said first and second static induction transistors and said first and second neutralizing capacitances are mounted on the same substrate, the substrate being of electrically insulating material and having a pattern of conductive mounting pads thereon;

the first static induction transistor being mounted on a first pad with its drain contact member in contact therewith and the first neutralizing capacitance being a first chip capacitor mounted directly on the first pad in close proximity to the first static induction transistor, and the second static induction transistor being mounted on a second pad with its drain contact member in contact therewith and the second neutralizing capacitance being a second chip capacitor mounted directly on the second pad in close proximity to the second static induction transistor whereby exceptionally good low impedance electrical connections are obtained between the drain electrodes of the static induction transistors and the neutralizing capacitances;

the gate contact member of the first static induction transistor and the second chip capacitor being connected to a third pad, and the gate contact member of the second static induction transistor and the first chip capacitor being connected to a fourth pad; and the source contact members of the first and second static induction transistors being connected to a fifth pad.

* * * * *